(12) United States Patent
Misumi

(10) Patent No.: US 9,006,839 B2
(45) Date of Patent: Apr. 14, 2015

(54) SEMICONDUCTOR DEVICE

(71) Applicant: Toyota Jidosha Kabushiki Kaisha, Toyota-shi, Aichi-ken (JP)

(72) Inventor: Tadashi Misumi, Nisshin (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 14/261,970

(22) Filed: Apr. 25, 2014

(65) Prior Publication Data

US 2014/0346561 A1    Nov. 27, 2014

(30) Foreign Application Priority Data

May 23, 2013 (JP) .................................. 2013-109360

(51) Int. Cl.
*H01L 27/06* (2006.01)
*H01L 29/739* (2006.01)

(52) U.S. Cl.
CPC .................................. *H01L 29/7395* (2013.01)

(58) Field of Classification Search
None
See application file for complete search history.

(56) References Cited

U.S. PATENT DOCUMENTS

| 2007/0040213 | A1* | 2/2007 | Hotta et al. | 257/330 |
|---|---|---|---|---|
| 2009/0218621 | A1* | 9/2009 | Pfirsch et al. | 257/342 |
| 2009/0278167 | A1* | 11/2009 | Ozoe | 257/139 |
| 2009/0294870 | A1* | 12/2009 | Arai et al. | 257/378 |
| 2010/0123240 | A1* | 5/2010 | Sato et al. | 257/692 |
| 2010/0140658 | A1* | 6/2010 | Koyama et al. | 257/140 |
| 2013/0134521 | A1 | 5/2013 | Misumi | |

FOREIGN PATENT DOCUMENTS

| JP | A-2007-110002 | 4/2007 |
|---|---|---|
| JP | A-2013-115223 | 6/2013 |

* cited by examiner

*Primary Examiner* — Steven Loke
*Assistant Examiner* — Samuel Park
(74) *Attorney, Agent, or Firm* — Oliff PLC

(57) ABSTRACT

In a semiconductor substrate of a semiconductor device, a drift layer, a body layer, an emitter layer, and a trench gate electrode are formed. When the semiconductor substrate is viewed in a plane manner, the semiconductor substrate is divided into a first region covered with a heat dissipation member, and a second region not covered with the heat dissipation member. A density of trench gate electrodes in the first region is equal to a density of trench gate electrodes in the second region. A value obtained by dividing an effective carrier amount of channel parts formed in the first region by an area of the first region is larger than a value obtained by dividing an effective carrier amount of channel parts formed in the second region by an area of the second region.

4 Claims, 3 Drawing Sheets

SEMICONDUCTOR DEVICE

INCORPORATION BY REFERENCE

The disclosure of Japanese Patent Application No. 2013-109360 filed on May 23, 2013 including the specification, drawings and abstract is incorporated herein by reference in its entirety.

BACKGROUND OF THE INVENTION

1. Field of the Invention

A technique disclosed in the present specification relates to a semiconductor device including a heat dissipation member.

2. Description of Related Art

In order to improve a short circuit capacity of a semiconductor device, a semiconductor device including a heat dissipation member is developed (for example, Japanese Patent Application Publication No. 2007-110002 (JP 2007-110002 A)). In the semiconductor device in JP 2007-110002 A, an IGBT (Insulated Gate Bipolar Transistor) is formed in an element region of a semiconductor substrate. An emitter electrode is formed on a top surface of the semiconductor substrate, and a heat spreader (a heat dissipation member) is disposed on a top surface of the emitter electrode. In an element region (a central part of the element region) below the heat spreader, a space between unit cells of the IGBT is narrowed, and in an element region (an outer peripheral part of the element region) around the heat spreader, a space between unit cells of the IGBT is made wide. Hereby, a current density of the outer peripheral part of the element region is smaller than a current density of the central part. This makes it possible to stably restrain a temperature increase of the semiconductor device in short-circuit of the semiconductor device, thereby making it possible to improve a short circuit capacity.

In the semiconductor device in JP 2007-110002 A, the space between the unit cells of the IGBT is made wide in the outer peripheral part of the element region. That is, a space between trench gate electrodes is wide in the outer peripheral part of the element region. This easily causes electric field concentration in tips of the trench gate electrodes in the outer peripheral part, which may decrease a withstanding voltage of the semiconductor device.

Note that the paragraph [0015] of JP 2007-110002 A suggests that a channel density of the outer peripheral part is reduced by not forming an emitter region in some unit cells placed in the outer peripheral part, without changing the space between the unit cells. However, in such a technique, a current flows only to part (a trench gate electrode where an emitter region is formed) of the outer peripheral part, which may cause a current density thereof to be excessive.

SUMMARY OF THE INVENTION

The present invention provides a technique that is able to improve a short circuit capacity and to restrain a decrease of a withstanding voltage of a semiconductor device.

A semiconductor device according to an aspect of the invention includes: a semiconductor substrate; a top surface electrode making contact with a top surface of the semiconductor substrate; a bottom surface electrode making contact with a bottom surface of the semiconductor substrate; and a heat dissipation member disposed above the top surface electrode. The semiconductor substrate includes: a drift layer having a first conductivity type; a body layer; a first semiconductor layer; a second semiconductor layer; trench gate electrodes; and a gate insulating film. The body layer has a second conductivity type and makes contact with a top surface of the drift layer. The first semiconductor layer has the first conductivity type, makes contact with a top surface of the body layer, is isolated from the drift layer by the body layer, is exposed on the top surface of the semiconductor substrate, and makes ohmic contact with the top surface electrode. The second semiconductor layer has the second conductivity type, makes contact with the top surface of the body layer, is isolated from the drift layer by the body layer, is exposed on the top surface of the semiconductor substrate, and makes ohmic contact with the top surface electrode. The trench gate electrodes are disposed in respective gate trenches, the respective gate trenches penetrating through the body layer from the top surface of the semiconductor substrate to reach the drift layer. The gate insulating film is disposed between each of the trench gate electrodes and a wall surface of a corresponding one of the gate trenches. When the semiconductor substrate is viewed in a plane manner, each of the trench gate electrodes includes a first part and a second part, the first part being opposite to the first semiconductor layer via the gate insulating film, and the second part being opposite to the second semiconductor layer via the gate insulating film. Furthermore, channel parts are formed in parts of the body layer which are opposite to the first parts of the trench gate electrodes. When the semiconductor substrate is viewed in a plane manner, the semiconductor substrate is divided into a first region covered with the heat dissipation member, and a second region not covered with the heat dissipation member. A density of the trench gate electrodes in the first region is equal to a density of the trench gate electrodes in the second region. A value obtained by dividing an effective carrier amount of the channel parts formed in the first region by an area of the first region is larger than a value obtained by dividing an effective carrier amount of the channel parts formed in the second region by an area of the second region.

Here, the "effective carrier amount of the channel parts" is an index to evaluate an amount of carriers moving in the channel parts. The "effective carrier amount of the channel parts" is typically calculated by multiplying an area of the channel parts by an amount of inversion carriers to be formed in the channel parts. Here, the inversion carrier is a carrier having a polarity different from that of the body layer and formed on a trench sidewall when an ON potential is applied to the gate electrode.

In the semiconductor device, the effective carrier amount of the channel parts is large in the first region (a region covered with the heat dissipation member) and is small in the second region (a region not covered with the heat dissipation member). This makes it possible to decrease a short-circuit energy density in the second region not covered by a heat dissipation member, at the time when the semiconductor device causes short-circuit. Furthermore, the heat dissipation member is disposed above the first region while the short-circuit energy density in the first region is large. This makes it possible to suitably restrain a temperature increase of the semiconductor device, thereby making it possible to improve a short circuit capacity. Further, since the first region and the second region have the same density of the trench gate electrodes, it is possible to restrain an electric field from concentrating on tips of the trench gate electrodes. This accordingly makes it possible to restrain a decrease of a withstanding voltage of the semiconductor device. Further, in the semiconductor device, the first semiconductor layer (a part where the channel parts are formed) and the second semiconductor layer (a part where no channel part is formed) are disposed in positions opposite to the trench gate electrodes. Hereby, the first semiconductor layer and the second semiconductor layer are placed appropriately, and thus, it is possible to flow a current through the entire of the first region and the second region generally uniformly.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 3 is a view illustrating a variation of a gate-emitter voltage with time, when the semiconductor device of the present embodiment is turned on;

FIG. 4 is a view illustrating variations of currents flowing through the main region and a sense region with time, when the semiconductor device of the present embodiment is turned on.

DETAILED DESCRIPTION OF EMBODIMENTS

In a semiconductor device described in the present specification, a first-conductivity impurity concentration of a first semiconductor layer in a first region may be equal to a first-conductivity impurity concentration of a first semiconductor layer in a second region. When the semiconductor substrate is viewed in a plane manner, a value obtained by dividing an area of channel parts formed in the first region by an area of the first region may be larger than a value obtained by dividing an area of channel parts formed in the second region by an area of the second region. According to such a configuration, without causing the impurity concentration of the first semiconductor layer in the first region to differ from that in the second region, it is possible to lower a short-circuit energy density of the second region than a short-circuit energy density of the first region. Accordingly, it is possible to form the first semiconductor layer of the first region and the first semiconductor layer of the second region in the same process.

In the semiconductor device described in the present specification, the semiconductor substrate may include a main part, and a sense part configured to detect a current flowing through the main part. In each of the main part and the sense part, a drift layer, a body layer, a first semiconductor layer, a second semiconductor layer, and a trench gate electrode may be formed. The sense part may be disposed in the second region. According to such a configuration, when an ON potential is applied to the trench gate electrode, the first region in the main part is turned on, and then the sense part is turned on. This makes it possible to restrain a surge current from flowing through the sense part, thereby making it possible to prevent false detection of an overcurrent due to the surge current.

In the semiconductor device described in the present specification, the first-conductivity impurity concentration of the first semiconductor layer in the first region may be larger than the first-conductivity impurity concentration of the first semiconductor layer in the second region. Even according to such a configuration, it is possible to lower a short-circuit energy density of the second region than a short-circuit energy density of the first region.

Figure 1:
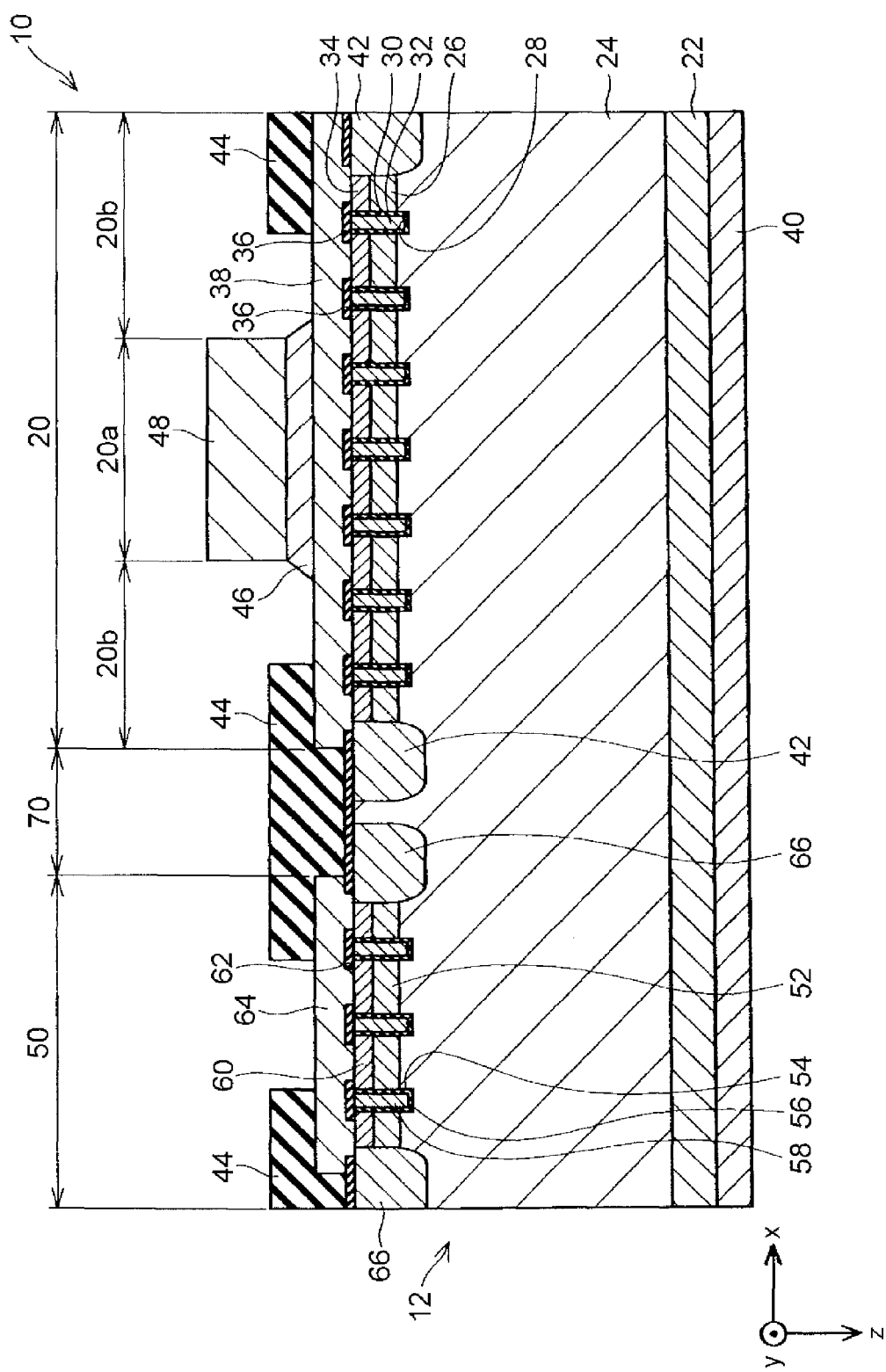
FIG. 1 is a drawing of a longitudinal section of a semiconductor device of the present embodiment.

The following describes a semiconductor device 10 of the present embodiment with reference to the drawings. As illustrated in FIG. 1, the semiconductor device 10 includes: a semiconductor substrate 12; insulating films 36, 44, 62, electrodes 38, 64, and a heat dissipation block 48 formed on a top surface of the semiconductor substrate 12; and an electrode 40 formed on a bottom surface of the semiconductor substrate 12. The semiconductor substrate 12 includes a main region 20, a sense region 50, and an isolation region 70. The isolation region 70 is disposed between the main region 20 and the sense region 50. A well-known substrate (e.g., a silicon substrate (a Si substrate), a silicon carbide substrate (a SiC substrate), or the like) may be used as the semiconductor substrate 12.

Note that a peripheral withstanding voltage region (not shown) is formed around the main region 20 and the sense region 50. Since the peripheral withstanding voltage region has a well-known structure (e.g., a RESURF structure, an FLR structure, or the like), a detailed description thereof is omitted herein. Further, in the present specification, a region where the main emitter electrode 38 (described later) is formed is referred to as the main region 20, and a region where the sense emitter electrode 64 (described later) is formed is referred to as the sense region 50.

Figure 2:
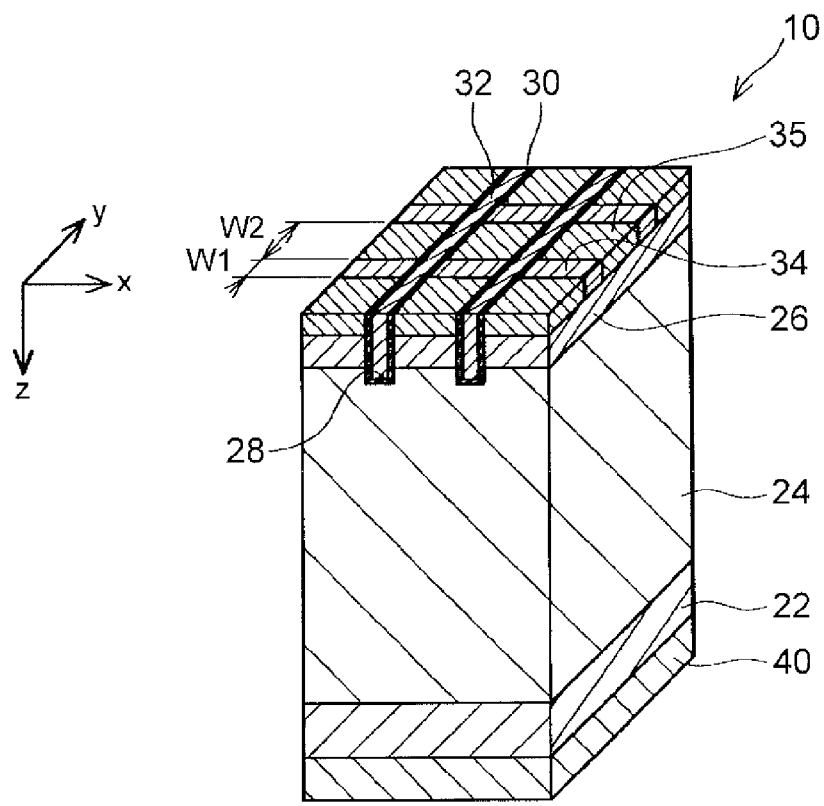
FIG. 2 is a perspective view of an essential part of an IGBT formed in a main region of a semiconductor substrate of the present embodiment.

Initially described is the main region 20. As illustrated in FIGS. 1, 2, in the main region 20 of the semiconductor substrate 12, emitter regions 34, body contact regions 35 (illustrated in FIG. 2), a body region 26, a drift region 24, and a collector region 22 are formed. The emitter region 34 is an $n^+$ type semiconductor region, and a plurality of emitter regions 34 is formed in a region facing the top surface of the semiconductor substrate 12. The emitter regions 34 extend in an x direction, and are separated from each other by gate trenches 28 (described later) extending in a y direction. A width of each of the emitter regions 34 in the y direction is taken as w1, and the emitter regions 34 are disposed at regular intervals (widths w2 to be described later) in the y direction.

The body contact region 35 is a $p^+$ type semiconductor region, and a plurality of body contact regions 35 is formed in the region facing the top surface of the semiconductor substrate 12. The body contact region 35 is disposed between adjacent emitter regions 34. The body contact regions 35 also extend in the x direction, and are separated from each other by the gate trenches 28 extending in the y direction. In each of the body contact regions 35, a width in the y direction is taken as w2, and the body contact regions 35 are disposed at regular intervals (the widths w1 of the emitter regions 34) in the y direction.

The body region 26 is a $p^-$ type semiconductor region, and formed below the emitter regions 34 and the body contact regions 35. The body region 26 faces bottom surfaces of the emitter regions 34 and bottom surfaces of the body contact regions 35. A p-type impurity concentration of the body region 26 is set lower than a p-type impurity concentration of the body contact regions 35.

The drift region 24 is an $n^-$ type semiconductor region, and formed below the body region 26. The drift region 24 makes contact with a bottom surface of the body region 26. The drift region 24 is isolated from the emitter regions 34 and the body contact regions 35 by the body region 26. The drift region 24 is formed in an entire surface of the semiconductor substrate 12. Accordingly, the drift region 24 is also formed in the sense region 50 and the isolation region 70.

The collector region 22 is a p+ type semiconductor region, and formed in a region facing the bottom surface of the semiconductor substrate 12. The collector region 22 makes contact with a bottom surface of the drift region 24. The collector region 22 is isolated from the body region 26 by the drift region 24. The collector region 22 is formed in the entire surface of the semiconductor substrate 12. Accordingly, the collector region 22 is also formed in the sense region 50 and the isolation region 70.

A plurality of gate trenches 28 is formed in the main region 20. The gate trenches 28 extend in the y direction, and are disposed at regular intervals in the x direction. The gate trenches 28 penetrate through the emitter regions 34, the body contact regions 35, and the body region 26, so that bottom ends of the gate trenches 28 reach the drift region 24. Since the emitter regions 34 and the body contact regions 35 extend in the x direction, the gate trench 28 has parts making contact with the emitter regions 34, and parts making contact with the body contact regions 35. In the gate trench 28, a gate electrode 32 is formed. A bottom end of gate electrode 32 is disposed slightly below the bottom surface of the body region 26. Polysilicon or the like can be used as a material of the gate electrode 32. An insulating film 30 is filled between a wall surface of the gate trench 28 and the gate electrode 32. In view of this, the gate electrode 32 is opposite to the body region 26, the emitter region 34, and the body contact region 35 via the insulating film 30. An insulating film 36 is formed on an upper part of the gate electrode 32. The gate electrode 32 is insulated from the main emitter electrode 38 by the insulating film 36.

The collector electrode 40 is formed on the bottom surface of the semiconductor substrate 12. The collector electrode 40 makes ohmic contact with the collector region 22. The collector electrode 40 is formed in the entire surface of the semiconductor substrate 12. Accordingly, the collector electrode 40 is formed not only in the main region 20, but also in the sense region 50 and the isolation region 70.

The main emitter electrode 38 is formed on the top surface of the semiconductor substrate 12. The main emitter electrode 38 is formed so as to cover the insulating films 36, and is insulated from the gate electrodes 32 by the insulating films 36. The main emitter electrode 38 makes ohmic contact with the emitter regions 34 and the body contact regions 35. The main emitter electrode 38 is formed on the main region 20 of the semiconductor substrate 12. Note that Al or the like can be used as a material of the main emitter electrode 38, for example.

The heat dissipation block 48 is disposed on the main emitter electrode 38. The heat dissipation block 48 is formed of a material having a high heat conductivity (e.g., a high heat conductor (Cu or the like) having a heat conductivity of 100 W/m·K or more). The heat dissipation block 48 is joined to the main emitter electrode 38 by a solder layer 46. The heat dissipation block 48 is disposed in a center of the main emitter electrode 38, but not disposed on an outer circumference of the main emitter electrode 38. That is, when the heat dissipation block 48 and the main emitter electrodes 38 are viewed in a plane manner, an area of the heat dissipation block 48 is smaller than an area of the main emitter electrode 38, and the heat dissipation block 48 is joined only to the center of the main emitter electrode 38. In the present specification, in the main region 20, a region covered with the heat dissipation block 48 is referred to as a central part 20a, and a region not covered with the heat dissipation block 48 is referred to as an outer peripheral part 20b.

As is apparent from the above description, a vertical Insulated Gate Bipolar Transistor (IGBT) is formed in the main region 20 of the semiconductor substrate 12. The IGBT formed in the main region 20 is surrounded by a diffusion layer 42. The diffusion layer 42 is a p+ type semiconductor region, and is formed in a region facing the top surface of the semiconductor substrate 12. The diffusion layer 42 makes contact with the emitter regions 34, the body contact regions 35, the body region 26, and the drift region 24, and surrounds the body region 26. The diffusion layer 42 is configured to reach a position below the bottom ends of the gate trenches 28.

Next will be described the sense region 50. An IGBT having the same structure as the main region 20 is also formed in the sense region 50. That is, in the sense region 50 of the semiconductor substrate 12, n+ type emitter regions 60, p+ type body contact regions, a p− type body region 52, the n− type drift region 24, and the p+ type collector region 22 are formed. Note that the body contact regions are not illustrated in FIG. 1, but are formed similarly to the body contact regions 35 of the main region 20 illustrated in FIG. 2. Further, a plurality of gate trenches 54 is also formed in the sense region 50, and in each of the gate trenches 54, a gate electrode 58 and an insulation film 56 are formed. In the sense region 50, the IGBT is constituted by the emitter regions 60, the body contact regions, the body region 52, the drift region 24, the collector region 22, the gate electrodes 58, and the insulating films 56. Note that an area of the IGBT formed in the sense region 50 is markedly smaller than an area of the IGBT formed in the main region 20.

In the sense region 50, the collector electrode 40 is also formed on the bottom surface of the semiconductor substrate 12. In the meantime, in the sense region 50, a sense emitter electrode 64 is formed on the top surface of the semiconductor substrate 12. The sense emitter electrode 64 is configured to cover the insulating film 62 so that the sense emitter electrode 64 is insulated from the gate electrodes 58 by the insulating film 62. The sense emitter electrode 64 makes ohmic contact with the emitter regions 60 and the body contact regions. Note that no heat dissipation block is disposed on the sense emitter electrode 64.

Further, the IGBT formed in the sense region 50 is surrounded by a diffusion layer 66. The diffusion layer 66 is a p+ type semiconductor region and formed in a region facing the top surface of the semiconductor substrate 12. The diffusion layer 66 makes contact with the emitter regions 60, the body contact regions, the body region 52, and the drift region 24. The diffusion layer 66 is configured to reach a position below the bottom ends of the gate trenches 54. The drift region 24 is disposed between the diffusion layer 66 and the diffusion layer 42, so that the diffusion layer 66 is isolated from the diffusion layer 42 by the drift region 24.

Note that, as illustrated in FIG. 1, the isolation region 70 is a region isolating the main region 20 from the sense region 50, and the drift region 24 is formed in a region facing the top surface of the semiconductor substrate 12. The insulating film 44 is formed respectively above the isolation region 70, a peripheral part of the main emitter electrode 38, and a peripheral part of the sense emitter electrode 64.

Here, in the semiconductor device 10 of the present embodiment, the width w1 of the emitter region 34 in the y direction and the width w2 of the body contact region 35 in the y direction vary in the central part 20a of the main region 20 and in the outer peripheral part 20b thereof (see FIG. 2). More specifically, a width w1a of the emitter region 34 in the central part 20a is set longer than a width w1b (<w1a) of the emitter region 34 in the outer peripheral part 20b. Accordingly, a width w2a of the body contact region 35 in the central part 20a is set shorter than a w2b (>w2a) of the body contact region 35 in the outer peripheral part 20b. In view of this, a channel ratio (w1a/(w1a+w2a)) of the central part 20a is set larger than a channel ratio (w1b/(w1b+w2b)) of the outer peripheral part 20b. As a result, a value (hereinafter referred to as an effective carrier density) obtained by dividing an effective carrier amount of channel parts formed in the central part 20a by an area of the central part 20a is larger than an effective carrier density of channel parts formed in the outer peripheral part 20b.

That is, in the main region 20, when an ON potential is applied to the gate electrode 32, a channel part is formed in that part of the body region 26 which is opposite to the gate electrode 32 via the insulating film 30 and which isolates the emitter region 34 from the drift region 24. The emitter region 34 is connected to the drift region 24 via this channel part, so that electrons (carriers) move to the drift region 24 from the emitter region 34. In the meantime, no channel part is formed in that part of the body region 26 which is opposite to the gate electrode 32 via the insulating film 30 and which is placed in a region where the body contact region 35 is formed. Accordingly, the width w1 of the emitter region 34 and an impurity concentration of the emitter region 34 affect an amount of carriers moving in the channel part.

As described above, the "effective carrier amount of the channel parts" is calculated from an area of the channel parts and a total amount of impurities in the emitter regions 34 to which the channel parts are connected. An area of the channel part is calculated from the width w1 of the emitter region 34 in the y direction (a width of a contact part between the emitter region 34 and the gate electrode 32 via the insulation film 30) and a thickness Δx of the channel part (a width in the x direction). In the present embodiment, since the p-type impurity concentration of the body region 26 does not vary in the central part 20a and in the outer peripheral part 20b, the thickness Δx of the channel part does not vary in the central part 20a and in the outer peripheral part 20b. Accordingly, in a case where the effective carrier density of the central part 20a is compared with the effective carrier density of the outer peripheral part 20b, only the width w1 of the emitter region 34 in the y direction may be taken into consideration.

Figure 5:
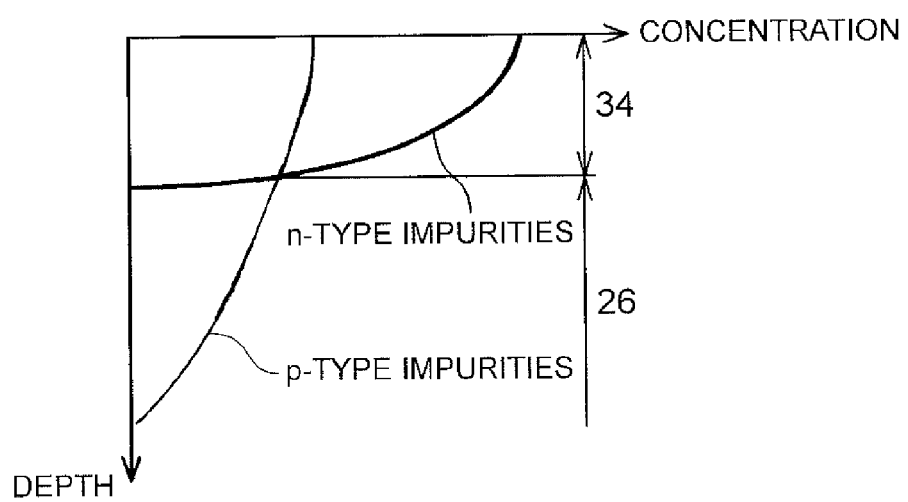
FIG. 5 is a view schematically illustrating a relationship of a depth from a surface of the semiconductor substrate of the present embodiment with respect to an impurity concentration of an emitter region.

Further, the total amount of impurities in the emitter region 34 is calculated by subtracting a total amount of p-type impurities from a total amount of n-type impurities in the emitter region 34. That is, as illustrated in FIG. 5, the impurity concentration of the emitter region 34 varies in a depth direction of the semiconductor substrate 12. More specifically, an n-type impurity concentration is high in the top surface of the semiconductor substrate 12, and becomes lower as it goes toward a deeper side. In the meantime, a p-type impurity concentration is high in the top surface of the semiconductor substrate 12, and becomes lower as it goes toward a deeper side. However, a p-type impurity concentration of the surface is set lower than an n-type impurity concentration of the surface. Accordingly, the emitter region 34 is a region in which the n-type impurity concentration is larger than the p-type impurity concentration. The total amount of impurities in the emitter region 34 is calculated by integrating "n-type impurity concentration" and "p-type impurity concentration". In the present embodiment, since the impurity concentration of the emitter region 34 does not vary in the central part 20a and in the outer peripheral part 20b, the total amount of impurities in the emitter region 34 does not vary in the central part 20a and in the outer peripheral part 20b.

Accordingly, the effective carrier density of the channel parts formed in the central part 20a is determined by the width w1 of the emitter region 34 in the y direction and the width w2 of the body contact region 35 in the y direction. That is, the effective carrier density of the central part 20a is determined by the channel ratio (w1a/(w1a+w2a)) of the central part 20a, and the effective carrier density of the outer peripheral part 20b is determined by the channel ratio (w1b/(w1b+w2b)) of the outer peripheral part 20b. In the present embodiment, since the channel ratio of the central part 20a is larger than the channel ratio of the outer peripheral part 20b, the effective carrier density of the central part 20a is also larger than the effective carrier density of the outer peripheral part 20b.

Note that, in the present embodiment, a width w1' of the emitter region 60 in the sense region 50 in the y direction is equal to the width w1b of the emitter region 34 in the outer peripheral part 20b in the y direction. Similarly, a width w2' of the body contact region in the sense region 50 in the y direction is equal to the width w2b of the body contact region 35 in the outer peripheral part 20b in the y direction. Further, an impurity concentration of the emitter region 60 in the sense region 50 is equal to the impurity concentration of the emitter region 34 in the main region 20, and an impurity concentration of the body region 52 in the sense region 50 is equal to the impurity concentration of the body region 26 in the main region 20. In view of this, a channel ratio (w1'/(w1'+w2')) of the sense region 50 is equal to the channel ratio (w1b/(w1b+w2b)) of the outer peripheral part 20b, and an effective carrier density of the sense region 50 is also equal to the effective carrier density of the outer peripheral part 20b.

Next will be described an operation of the semiconductor device 10. In a state where the main emitter electrode 38 and the sense emitter electrode 64 are connected to ground potentials and the collector electrode 40 is connected to a power supply potential, when an ON potential is applied to the gate electrodes 32, 58, the semiconductor device 10 is turned on. The ON potential is equal to or higher than a potential necessary to form channel parts in the body regions 26, 52. That is, application of an ON potential to the gate electrodes 32, 58 causes channel parts to be formed in those parts of the body regions 26, 52 which make contact with the insulation films 30, 56. Then, in the main region 20, electrons are supplied to the drift region 24 from the main emitter electrode 38 via the emitter regions 34 and the channel parts, and further, holes are supplied to the drift region 24 from the collector electrode 40 via the collector region 22. Hereby, a current flows from the collector electrode 40 to the main emitter electrode 38. Similarly, in the sense region 50, a current flows from the collector electrode 40 to the sense emitter electrode 64. Here, a ratio (a so-called sense ratio) between a current $I_1$ flowing through the main region 20 and a current $I_2$ flowing through the sense region 50 is determined by an area ratio between the main region 20 and the sense region 50, and is generally a uniform value. In view of this, when the current flowing through the sense region 50 is detected, it is possible to calculate a current value flowing through the main region 20, based on the current value thus detected and the sense ratio.

Figure 3:
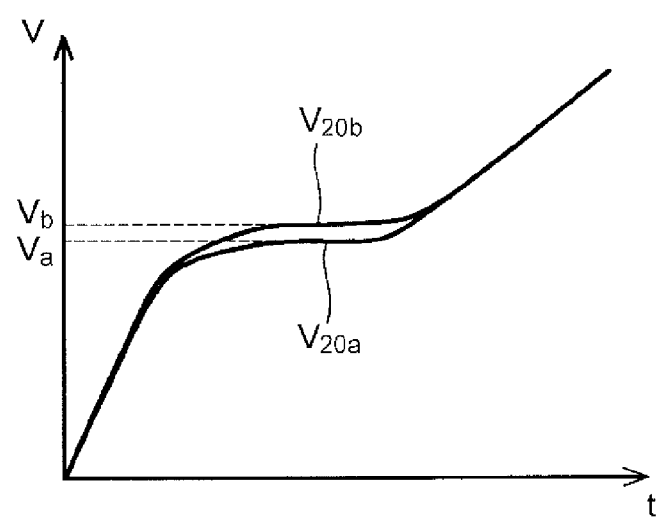
Figure 4:
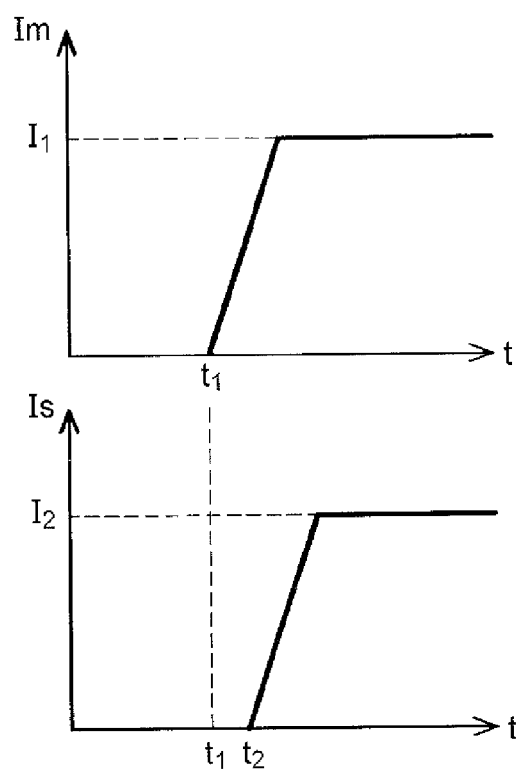

As described above, the channel ratio of the central part 20a of the main region 20 is set larger than the channel ratio of the outer peripheral part 20b of the main region 20 and the channel ratio of the sense region 50. Accordingly, as illustrated in FIG. 3, a voltage Va of the gate electrode 32 at the time when the central part 20a is turned on is larger than a voltage Vb of the gate electrode 32 at the time when the outer peripheral part 20b is turned on. The voltage Vb is equal to a voltage of the gate electrode 58 at the time when the sense region 50 is turned on. Accordingly, when an ON potential is applied to the gate electrodes 32, 58, a current initially flows through the central part 20a of the main region 20, and then, a current flows through the outer peripheral part 20b of the main region 20 and the sense region 50. That is, as illustrated in FIG. 4, the current flowing through the main region 20 starts to flow at a time t1, and the current I₂ flowing through the sense region 50 starts to flow at a time t2 later than the time t1. As a result, it is possible to restrain a surge current from flowing through the sense region 50 at the time when the semiconductor device 10 is turned on. As a result, it is possible to prevent such a misdetection that an overcurrent flows through the semiconductor device 10.

Further, when the semiconductor device 10 is in a short-circuit state, large currents flow through the main region 20 and the sense region 50. Here, the channel ratio of the central part 20*a* of the main region 20 is set larger than the channel ratio of the outer peripheral part 20*b* of the main region 20 and the channel ratio of the sense region 50. Accordingly, collector saturation currents of the outer peripheral part 20*b* of the main region 20 and the sense region 50 are smaller than a collector saturation current of the central part 20*a* of the main region 20. As a result, short-circuit energy densities of the outer peripheral part 20*b* of the main region 20 and the sense region 50 are decreased. This accordingly makes it possible to restrain a temperature increase in these regions 20*b*, 50. Furthermore, the heat dissipation block 48 is disposed in the central part 20*a* while a short-circuit energy density of the central part 20*a* becomes large. Therefore, it is possible to effectively dissipate heat of the central part 20*a* to its outside. Thus, by equalizing a temperature of the semiconductor substrate 12 so as to restrain a temperature increase of the semiconductor substrate 12, it is possible to improve a short circuit capacity of the semiconductor device 10.

Note that, in the semiconductor device 10 of the present embodiment, the widths of the emitter region and the body contact region in the y direction are only adjusted, and the impurity concentrations of the emitter regions and the body regions are uniform in the regions 20*a*, 20*b*, 50. Accordingly, it is possible to form the emitter regions and the body regions of the regions 20*a*, 20*b*, 50 in the same step. In view of this, a shape of a mask at the time of ion injection may be just changed, and the number of manufacturing steps is not increased.

Further, in the semiconductor device 10 of the present embodiment, since the gate electrodes 32, 58 are disposed at regular intervals, it is possible to restrain an electric field from being concentrated on the tips of the gate electrodes 28, 58. This makes it possible to restrain a decrease of a withstanding voltage of the semiconductor device 10. Further, the emitter regions and the body contact regions are placed alternately in the y direction, and these regions are opposite to the gate electrodes 32, 58. Accordingly, currents flow by using all the gate electrodes 32, 58, which makes it possible to flow the currents uniformly entirely through the main region 20 and the sense region 50. As a result, it is possible to restrain such a situation that a current flows through part of the semiconductor substrate 12 locally.

The embodiment of the present invention has been described in detail, but the embodiment is only an example. The invention may include embodiments obtained by variously modifying or altering the concrete embodiments exemplified as above.

For example, in the above embodiment, the short-circuit energy densities of the central part 20*a* and the outer peripheral part 20*b* (the sense region 50) are adjusted by adjusting the width w1 of the emitter regions and the width w2 of the body contact regions, but the technique described in the present specification is not limited to such an embodiment. The short-circuit energy densities of the central part 20*a* and the outer peripheral part 20*b* (the sense region 50) may be adjusted by adjusting the impurity concentration of the emitter regions. For example, the n-type impurity concentration of the emitter regions of the central part 20*a* is set larger than the n-type impurity concentration of the emitter regions of the outer peripheral part 20*b* (the sense region 50). Even according to such a configuration, it is possible to decrease the short-circuit energy density of the outer peripheral part 20*b* (the sense region 50), thereby making it possible to improve the short circuit capacity. Further, the short-circuit energy densities of the central part 20*a* and the outer peripheral part 20*b* (the sense region 50) may be adjusted by adjusting the impurity concentration and/or the thickness of the body region. For example, the p-type impurity concentration of the body region of the central part 20*a* is set lower than the p-type impurity concentration of the body region of the outer peripheral part 20*b* (the sense region 50). Alternatively, the thickness of the body region of the central part 20*a* is set smaller than the thickness of the body region of the outer peripheral part 20*b* (the sense region 50). Even according to such a configuration, it is possible to decrease the short-circuit energy density of the outer peripheral part 20*b* (the sense region 50), thereby making it possible to improve the short circuit capacity. Further, the short-circuit energy densities may be adjusted by performing the above at the same time.

Further, in the above embodiment, the IGBT is formed in the semiconductor substrate 12, but a semiconductor element to be formed in the semiconductor substrate 12 is not limited to the IGBT and may be other semiconductor elements (e.g., MOSFET).

Technical elements described in the present specification or the drawings exhibit a technical usability solely or in various combinations. Further, the technique exemplified in the present specification or the drawings can achieve a plurality of objects at the same time, and has a technical usability by achieving one of those objects.

What is claimed is:

1. A semiconductor device comprising:
   a semiconductor substrate;
   a top surface electrode making contact with a top surface of the semiconductor substrate;
   a bottom surface electrode making contact with a bottom surface of the semiconductor substrate; and
   a heat dissipation member disposed above the top surface electrode, wherein:
   the semiconductor substrate includes
      a drift layer having a first conductivity type,
      a body layer having a second conductivity type, the body layer making contact with a top surface of the drift layer,
      a first semiconductor layer having the first conductivity type, the first semiconductor layer making contact with a top surface of the body layer, isolated from the drift layer by the body layer, exposed on the top surface of the semiconductor substrate, and making ohmic contact with the top surface electrode,
      a second semiconductor layer having the second conductivity type, the second semiconductor layer making contact with the top surface of the body layer, isolated from the drift layer by the body layer, exposed on the top surface of the semiconductor substrate, and making ohmic contact with the top surface electrode,
      trench gate electrodes disposed in respective gate trenches, the respective gate trenches penetrating through the body layer from the top surface of the semiconductor substrate to reach the drift layer, and
      a gate insulating film disposed between each of the trench gate electrodes and a wall surface of a corresponding one of the gate trenches;

when the semiconductor substrate is viewed in a plane manner, each of the trench gate electrodes includes a first part and a second part, the first part being opposite to the first semiconductor layer via the gate insulating film, and the second part being opposite to the second semiconductor layer via the gate insulating film;

channel parts are formed in parts of the body layer which are opposite to the first parts of the trench gate electrodes;

when the semiconductor substrate is viewed in a plane manner, the semiconductor substrate is divided into a first region covered with the heat dissipation member, and a second region not covered with the heat dissipation member;

a density of the trench gate electrodes in the first region is equal to a density of the trench gate electrodes in the second region; and a value obtained by dividing an effective carrier amount of the channel parts formed in the first region by an area of the first region is larger than a value obtained by dividing an effective carrier amount of the channel parts formed in the second region by an area of the second region.

2. The semiconductor device according to claim 1, wherein:

a first conductivity impurity concentration of the first semiconductor layer in the first region is equal to a first conductivity impurity concentration of the first semiconductor layer in the second region; and when the semiconductor substrate is viewed in the plane manner, a value obtained by dividing an area of the channel parts formed in the first region by the area of the first region is larger than a value obtained by dividing an area of the channel parts formed in the second region by the area of the second region.

3. The semiconductor device according to claim 2, wherein:

the semiconductor substrate includes a main part, and a sense part configured to detect a current flowing through the main part;

each of the main part and the sense part includes the drift layer, the body layer, the first semiconductor layer, the second semiconductor layer, and the trench gate electrodes; and the sense part is disposed in the second region.

4. The semiconductor device according to claim 1, wherein a first conductivity impurity concentration of the first semiconductor layer in the first region is larger than a first conductivity impurity concentration of the first semiconductor layer in the second region.

* * * * *